(12) United States Patent
Brunie

(10) Patent No.: US 11,294,627 B2
(45) Date of Patent: Apr. 5, 2022

(54) FLOATING POINT DOT-PRODUCT OPERATOR WITH CORRECT ROUNDING

(71) Applicant: Kalray, Montbonnot Saint Martin (FR)

(72) Inventor: Nicolas Brunie, Grenoble (FR)

(73) Assignee: Kalray, Montbonnot Saint Martin (FR)

( * ) Notice: Subject to any disclaimer, the term of this patent is extended or adjusted under 35 U.S.C. 154(b) by 0 days.

(21) Appl. No.: 16/946,526

(22) Filed: Jun. 25, 2020

(65) Prior Publication Data
US 2020/0409661 A1 Dec. 31, 2020

(30) Foreign Application Priority Data
Jun. 25, 2019 (FR) .................................... 19 06887

(51) Int. Cl.
*G06F 7/487* (2006.01)
*G06F 7/499* (2006.01)
*H03M 7/24* (2006.01)

(52) U.S. Cl.
CPC ........ *G06F 7/4876* (2013.01); *G06F 7/49936* (2013.01); *G06F 7/49947* (2013.01); *H03M 7/24* (2013.01)

(58) Field of Classification Search
CPC .... G06F 7/5443; G06F 7/49936; G06F 5/012; G06F 2207/3812; G06F 2207/382; G06F 2207/3824; G06F 2207/4824; H03M 7/24
See application file for complete search history.

(56) References Cited

U.S. PATENT DOCUMENTS

| 2014/0089371 | A1* | 3/2014 | Dupont De Dinechin ................... G06F 7/483 708/503 |
| 2015/0177610 | A1 | 6/2015 | Li et al. |
| 2018/0157464 | A1* | 6/2018 | Lutz .................... G06F 9/30025 |
| 2018/0315399 | A1 | 11/2018 | Kaul et al. |
| 2018/0322607 | A1 | 11/2018 | Mellempudi et al. |
| 2020/0089472 | A1* | 3/2020 | Pareek .................. G06F 9/3887 |

FOREIGN PATENT DOCUMENTS

WO    WO-2020067908 A1 *   4/2020   ........... G06F 7/5443

OTHER PUBLICATIONS

Nicolas Brunie, "Modified Fused Multiply and Add for Exact Low Precision Product Accumulation,"2017 IEEE 24th Symposium on Computer Arithmetic (ARITH), 2017, pp. 106-113 (Year: 2017).*
Nicolas Brunie, "Contributions to computer arithmetic and applications to embedded systems", Ecole normale supérieure de lyon—Ens Lyon, 2014 (Year: 2014).*

(Continued)

*Primary Examiner* — Matthew D Sandifer

(57) ABSTRACT

The disclosure relates to a hardware operator for dot-product computation, comprising a plurality of multipliers each receiving two multiplicands in the form of floating-point numbers encoded in a first precision format; an alignment circuit associated with each multiplier, configured to, based on the exponents of the corresponding multiplicands, convert the result of the multiplication into a respective fixed-point number having a sufficient number of bits to cover the full dynamic range of the multiplication; and a multi-adder configured to add without loss the fixed-point numbers provided by the multipliers, providing a sum in the form of a fixed-point number.

5 Claims, 3 Drawing Sheets

(56) References Cited

OTHER PUBLICATIONS

Dipankar Das, et al., "Mixed Precision Training of Convolutional Neural Networks Using Integer Operations," Published as a conference paper at ICLR 2018, Feb. 23, 2018, 11 pages.

Matthieu Courbariaux, et al., "Training Deep Neural Networks with Low Precision Multiplicatons," Accepted as a workshop contribution at ICLR 2015, Sep. 23, 2015, 10 pages.

* cited by examiner

FLOATING POINT DOT-PRODUCT OPERATOR WITH CORRECT ROUNDING

CROSS-REFERENCE TO RELATED APPLICATION

This application is based on and claims priority under 35 U.S.C. 119 to French Patent Application No. 19 06887 filed on Jun. 25, 2019, in the National Institute of Industrial Property, the disclosure of which is herein incorporated by reference in its entirety.

FIELD

The disclosure relates to hardware operators for processing floating-point numbers in a processor core, and more particularly to an operator for calculating a dot-product based on a Fused Multiply-Add operator, commonly referred to as FMA.

BACKGROUND

Artificial intelligence technologies, especially deep learning, are particularly demanding in terms of the multiplication of large matrices, which can have several hundred rows and columns. Hardware accelerators are thus emerging that are specialized in mixed precision matrix multiplication.

The multiplication of large matrices is generally carried out in blocks, i.e. by breaking down the matrices into sub-matrices of a size adapted to the computational resources. Accelerators are thus designed to efficiently compute the products of these sub-matrices. Such accelerators include an operator capable, in one instruction cycle, of calculating the dot-product of vectors representing a row and a column of a sub-matrix and adding the corresponding partial result to partial results accumulated in previous cycles. After a number of cycles, the accumulation of the partial results is the dot-product of the vectors representing a row and a column of a full matrix.

Such operators make use of the FMA techniques.

FIG. 1 schematically illustrates a conventional FMA operator. The operator generally takes three binary floating-point operands, namely two multiplication operands, or multiplicands a and b, and an addition operand c. It calculates the term ab+c to produce a result s in a register designated ACC. The register is so designated because it is generally used to accumulate several products in several cycles, reusing, as illustrated by a dashed line, the output of the register as the addition operand c in the next cycle.

In the paper ["Modified Fused Multiply and Add for Exact Low Precision Product Accumulation", Nicolas Brunie, IEEE 24th Symposium on Computer Arithmetic (ARITH), July 2017], multiplicands a and b are in a half-precision floating-point format, also called "binary16" or "fp16", according to the IEEE-754 standard. A number in the "fp16" format has a sign bit, a 5-bit exponent, and a 10+1-bit mantissa (including an implicit bit encoded in the exponent).

The ACC register is designed to accommodate the full dynamics of the product ab in a fixed-point format. For multiplicands in "fp16" format, an 80-bit register (plus possibly a few overflow bits) is sufficient, the fixed point being located at position 49 of the register. The addition operand c is in the same format as the contents of the ACC register.

This structure makes it possible to obtain an exact result for each operation ab+c, and to maintain an exact accumulation result cycle after cycle, as long as the register does not overflow, thus avoiding rounding errors and the loss of precision following the addition of numbers of opposite sign but close in absolute value.

The above-mentioned article further proposes, in a mixed-precision FMA configuration, to convert the contents of the register to a higher-precision format, e.g. "binary32", at the end of an accumulation phase. However, the number thus converted does not cover the full dynamics of the "binary32" format, since the exponent of the product ab is defined only over 6 bits instead of 8.

FIG. 2 schematically illustrates an application of the FMA structure to an accumulating dot-product operator, as described, for example, in US patent application 2018/0321938. Four pairs of multiplicands (a1, b1), (a2, b2), (a3, b3) and (a4, b4) are provided to respective multipliers. The four resulting products p1 to p4, called partial products, and an addition operand c are simultaneously added by an adder tree. The multiplicands and the addition operand are all in the same floating-point format. The result of the addition is normalized and rounded to be converted to the initial floating-point format, so that it can be reused as operand c.

To add the partial products and the addition operand, the exponents of these terms are compared to align the mantissas of the terms with each other. Only a window of significant bits corresponding to the highest exponent is kept for addition and rounding, a window which corresponds to the size of the adder. As a result, the mantissas of the lower exponent terms are truncated, or eliminated altogether, producing large errors when two partial products of large exponents cancel each other.

The above-mentioned patent application does not mention any particular size of adder. In the same context of addition of partial products, Nicolas Brunie's 2014 thesis entitled "Contributions to computer arithmetic and applications to embedded systems", proposes an adder size equal to twice the mantissa size of the partial products plus a margin of overflow of two bits, i.e. 98 bits for multiplicands in binary32 format. In the same context, patent U.S. Pat. No. 8,615,542, for adding four partial products, provides an adder size equal to only the mantissa size of the multiplicands, i.e. 24 bits for multiplicands in binary32 format.

SUMMARY

A fused multiply-add hardware operator is generally provided, comprising a multiplier receiving two multiplicands as floating-point numbers encoded in a first precision format; an alignment circuit associated with the multiplier configured to, based on the exponents of the multiplicands, convert a result of the multiplication into a first fixed-point number having a sufficient number of bits to cover a full dynamic range of the multiplication; and an adder configured to add the first fixed-point number and an addition operand. Thee addition operand is a floating-point number encoded in a second precision format having a higher precision than the first precision format, and the operator comprises an alignment circuit associated with the addition operand, configured to, based on the exponent of the addition operand, convert the addition operand into a second fixed-point number of reduced dynamic range relative to the dynamic range of the addition operand, having a number of bits equal to the number of bits of the first fixed-point number, extended on both sides by at least the size of the mantissa of the addition operand; and the adder is configured to add the first and second fixed-point numbers without loss.

The operator may further comprise a rounding and normalization circuit configured to convert the adder result to a floating-point number in the second precision format, taking the mantissa from the most significant bits of the adder result, calculating the rounding from the remaining bits of the adder result, and determining the exponent from the position of the most significant bit in the adder result.

The second fixed-point number may be extended to the right by a number of bits at least equal to the size of the mantissa of the addition operand; and the rounding circuit may use the bits of the extension of the second fixed-point number to calculate the rounding.

The operator may be configured to provide as a result the addition operand when the exponent of the addition operand exceeds the capacity of the second fixed-point number.

An associated method of fused multiplication and addition of binary numbers comprises the steps of multiplying the mantissas of two floating-point multiplicands encoded in a first precision format; converting the multiplication result into a first fixed-point number having a sufficient number of bits to cover the full dynamic range of the multiplication result; and adding the first fixed-point number and an addition operand. The addition operand is a floating-point number encoded in a second precision format having a higher precision than the first precision format, and the method comprises further steps of converting the addition operand into a second fixed-point number with reduced dynamic range relative to the dynamic range of the addition operand, having a number of bits equal to the number of bits of the first fixed-point number, extended on either side by at least the size of the mantissa of the addition operand; and adding the first and second fixed-point numbers without loss.

In another aspect, a hardware operator for dot-product computation is generally provided, comprising a plurality of multipliers each receiving two multiplicands in the form of floating-point numbers encoded in a first precision format; an alignment circuit associated with each multiplier, configured to, based on the exponents of the corresponding multiplicands, convert the result of the multiplication into a respective fixed-point number having a sufficient number of bits to cover the full dynamic range of the multiplication; and a multi-adder configured to add without loss the fixed-point numbers provided by the multipliers, providing a sum in the form of a fixed-point number.

The operator may further comprise an input for a floating-point addition operand encoded in a second precision format having a higher precision than the first precision format; an alignment circuit associated with the addition operand, configured to, based on the exponent of the addition operand, convert the addition operand into a fixed-point number of reduced dynamic range relative to the dynamic range of the addition operand, having a number of bits equal to the number of bits of the fixed-point sum, extended on either side by at least the size of the mantissa of the addition operand; and an adder configured to add without loss the fixed-point sum and the fixed-point number of reduced dynamic range.

The operator may further comprise a rounding and normalization circuit configured to convert the adder result into a floating-point number encoded in the second precision format, taking the mantissa from the most significant bits of the adder result, calculating the rounding from the remaining bits of the adder result, and determining the exponent from the position of the most significant bit in the adder result.

The fixed-point number of reduced dynamic range may be extended to the right by a number of bits at least equal to the size of the mantissa of the addition operand; and the rounding circuit may use the bits of the extension of the fixed-point number of reduced dynamic range to calculate the rounding.

The operator according may be configured to provide as a result the addition operand when the exponent of the addition operand exceeds the capacity of the fixed-point number of reduced dynamic range.

An associated method of calculating a dot-product of binary numbers, comprises steps of calculating a plurality of multiplications in parallel, each from two multiplicands that are floating-point numbers encoded in a first precision format; based on the exponents of the multiplicands of each multiplication, converting the result of the corresponding multiplication into a respective fixed-point number having a sufficient number of bits to cover the full dynamic range of the multiplication; and adding without loss the fixed-point numbers resulting from the multiplications to produce a sum in the form of a fixed-point number.

The method may further comprise steps of receiving a floating-point addition operand encoded in a second precision format having a higher precision than the first precision format; on the basis of the exponent of the addition operand, converting the addition operand into a fixed-point number having a reduced dynamic range relative to the dynamic range of the addition operand, having a number of bits equal to the number of bits of the fixed-point sum, extended on both sides by at least the size of the mantissa of the addition operand; and adding without loss the fixed-point sum and the fixed-point number of reduced dynamic range.

BRIEF DESCRIPTION OF THE DRAWINGS

Embodiments will be set out in the following non-limiting description, in relation to the attached figures, among which.

DETAILED DESCRIPTION

In order to improve the computation accuracy during multiple phases of accumulation of partial products, it is desired to implement a mixed precision FMA, i.e. having an addition operand of a higher precision than the multiplicands. Indeed, during repeated accumulations, the addition operand tends to increase continuously while the partial products remain bounded.

The above-mentioned IEEE article by Nicolas Brunie proposes a solution offering accurate computations adapted to multiplicands of binary16 format, whose product can be represented in a fixed-point format using 80 bits, a format that remains acceptable for hardware processing within the processing units of a processor core.

However, the product of two binary16 numbers produces a non-standard floating-point number having one sign bit, 6 exponent bits and 21+1 mantissa bits, encoded over 28 bits. Such a format may only be used internally. It is then desired that the addition operand be in a higher precision standard format. For example, the addition operand may be of immediately higher precision, i.e. binary32, having one sign bit, 8 exponent bits, and 23+1 mantissa bits. The binary32 format would thus require 277 bits for a fixed-point encoding, a size too large for hardware processing in a reduced complexity processor core that is to be duplicated tens of times in an integrated circuit chip.

Figure 1:
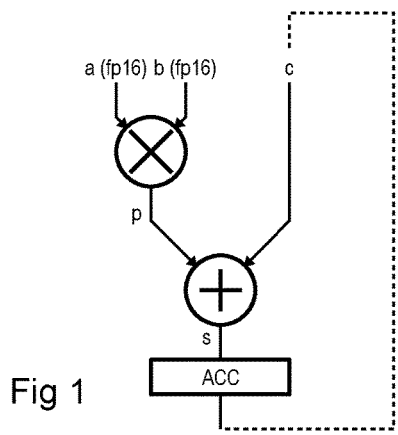
FIG. 1, previously described, represents a schematic diagram of a conventional fused multiply-add operator, known as FMA.
Figure 2:
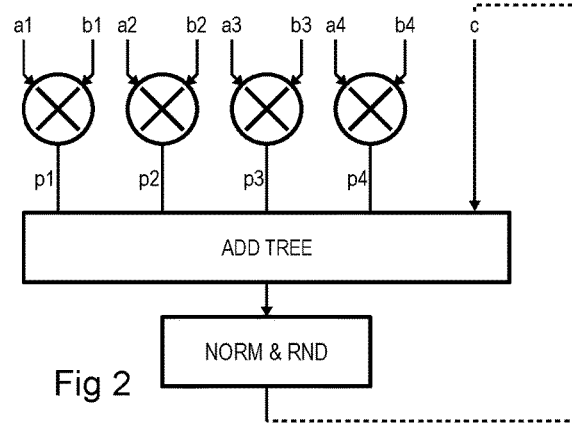
FIG. 2, previously described, represents a schematic diagram of a conventional accumulating dot-product operator.
Figure 3:
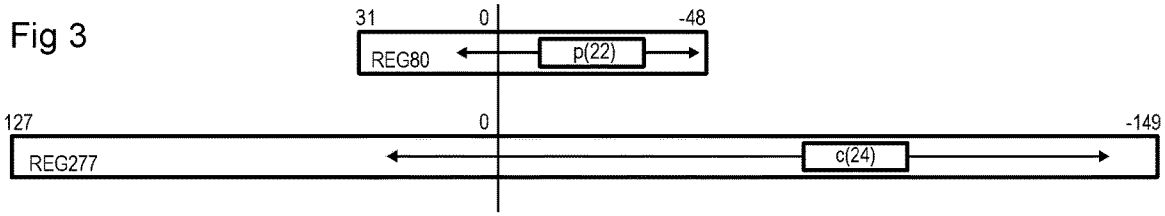
FIG. 3 illustrates numbers in a fixed-point format used in a mixed precision binary16/binary32 FMA operator.

The top of FIG. 3 shows a fixed-point format that can be used for a product of binary16 multiplicands. The format is embodied by an 80-bit register REG80 whose bits are designated by the corresponding exponents of the product. The exponent 0, corresponding to the fixed point, is located at the 49th bit. The first bit corresponds to the exponent −48, while the last bit corresponds to the exponent 31.

The 22-bit mantissa p(22) of the product is positioned in the register such that its most significant bit is at the position defined by the sum of the exponents of the two multiplicands, plus 1.

FIG. 3 illustrates in its lower part a fixed-point format that can be used for a binary32 operand. The format is materialized by a 277-bit register REG277. The required size is given by the relation exponent_max−exponent_min+1+ (mantissa_size−1).

The exponent 0, corresponding to the fixed point, is located at the 150th bit. The first bit corresponds to the exponent −149, while the last bit corresponds to the exponent 127.

The 24-bit mantissa c(24) of the operand is positioned in the register so that its most significant bit is at the position defined by the exponent of the operand.

In order to perform an exact addition of the operand c and the product p, an adder of the size of the largest number, i.e. 277 bits, should in principle be used. However, since a result in a standard floating-point format is expected, this exact result will necessarily be rounded. In this case, the aim is to ensure that the result is rounded correctly, i.e. that the rounding calculation takes into account all the bits of the exact result.

To produce a correctly rounded mantissa from an exact result having more bits than the mantissa, three bits immediately following the mantissa in the exact result are used, called guard bit G, round bit R, and sticky bit S. These three bits determine whether or not to increment the mantissa according to a chosen rounding mode. To ensure the best accuracy after a sequence of signed sums, the "round to nearest" mode is preferred.

It should be noted, however, that the value of the sticky bit S is not strictly the value of the bit after the rounding bit R—it is a bit that is set to 1 if any of the bits to the right of the rounding bit is at 1. Thus, to calculate a correct rounding in all circumstances, all the bits of the exact result are required.

However, in order to reduce the size of the adder to a reasonable value, the property is used that, when adding a fixed-point number of 80 bits and a fixed-point number of 277 bits, a large range of the 277-bit number is unnecessary for calculating correct rounding when converting the result of the addition to a floating-point number. Indeed, two cases can be distinguished as shown in FIGS. 4A and 4B.

Figure 4A:
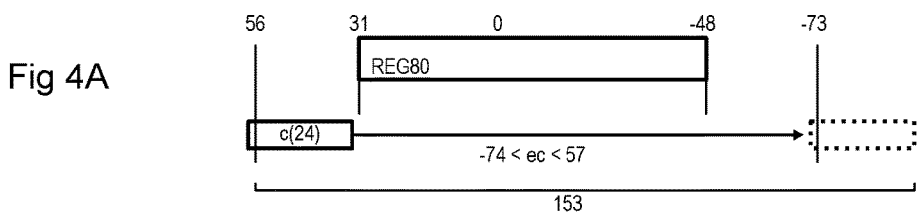
FIG. 4A illustrates a lossless compression technique for the dynamic range of the fixed-point representation of the binary32 format.
Figure 4B:
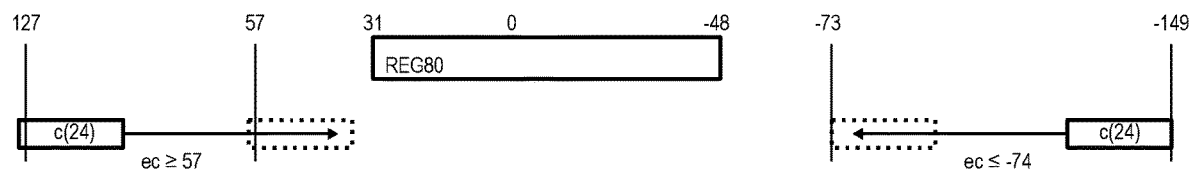
FIG. 4B illustrates a lossless compression technique for the dynamic range of the fixed-point representation of the binary32 format.

FIG. 4A illustrates a nominal case where the operand c and the product p may have a mutual influence that affects the result of the addition, either directly or through rounding effects. The exponent of the operand c is strictly between −74 and 57. (Hereafter the term "position" is defined in relation to the fixed-point format, i.e. a position corresponds to an exponent.)

For the boundary case of exponent 56, the mantissa c(24) is positioned in segment [56:33] of the fixed-point format and there is a guard bit G at position 32, between the least significant bit of the mantissa c(24) and the most significant bit of the register REG80.

When register REG80 contains a positive number, the guard bit G is at 0. The addition is simply a concatenation of the segment [56:32], including the mantissa c(24) and guard bit, and the register REG80. Since the result of the addition should be converted to a binary32 number, the resulting mantissa is the mantissa c(24), possibly adjusted by rounding. For the "round to nearest" mode, a guard bit G at 0 indicates that no adjustment is required, in which case the mantissa c(24) is used directly in the converted result.

When the content of register REG80 is negative, the guard bit G receives a sign bit of 1, in which case the mantissa c(24) may require adjustment upon rounding.

For the boundary case of exponent −73, the mantissa c(24) is positioned in the segment [73:−96] and there are 24 guard bits at 0 [−49:−72] between the least significant bit of the register REG80 and the most significant bit of the mantissa c(24).

In this situation, if operand c is positive, the addition is simply a concatenation of the register REG80 and the segment [49:−96], including the 24 guard bits at 0 and the mantissa c(24). Since the result of the addition should be converted to a binary32 number, the resulting mantissa is normally taken from the register REG80. However, when the product is at the smallest absolute value of its dynamic range, i.e. $2^{-48}$, the mantissa of the result is taken from the last bit of register REG80 and the next 23 bits, actually the segment [−48:−71], leaving one guard bit G at 0 at position −72, just before the mantissa c(24).

For rounding "to the nearest", the guard bit G at 0 indicates that there is no adjustment to be made, in which case the mantissa taken from the register REG80 extended by the segment [−49:−71] is used directly in the converted result.

If operand c is negative, the guard bit G at position −72 receives a sign bit at 1, in which case the taken mantissa may require adjustment upon rounding.

FIG. 4B illustrates a situation where operand c has an exponent e outside the domain of FIG. 4A, namely e≥57 or e≤−74. In this situation, the product p and operand c have no mutual influence on a final result to be provided in binary32 format. For the "round to nearest" mode, either the operand c is so large (e≥57) that the product p has no influence and the operand c can be supplied directly as the final result, without addition; or the operand c is so small (e≤−74) that it has no influence and the contents of the register REG80 can be used directly for the final result, without addition.

This situation should not normally occur unless a corresponding initial value for operand c is provided.

Nevertheless, to ensure that rounding is always calculated on an exact value, and thus to guarantee that it is formally correct in all circumstances and for all rounding modes, all bits of the mantissas of operand c and product p can be taken into account in this situation as well. In fact, this situation corresponds to the case where the guard and round bits G and R are both 0, and only the value of the sticky bit S is of interest. For the "round to nearest" and "round to 0" modes, the value 0 of the single bit G indicates that no adjustment is necessary and the value of the bit S is irrelevant. On the other hand, for the "round to infinity" modes, if the sign of the result corresponds to the rounding direction (for example, a positive result rounded to "plus infinity"), the value 1 of bit S causes an increment of the mantissa, even if bits G and R are 0.

Thus, when $e \geq 57$, the sticky bit S takes into account the contents of the register REG80.

When $e \leq -74$, the sticky bit S takes into account the mantissa c(24).

It follows from these elements that, in order to calculate the final result in binary32 floating-point format with correct rounding, it is sufficient to encode the operand c in a fixed-point format over the reduced variation range defined in FIG. 4A, i.e. over the 153-bit segment [56:−96] and to deal with the out of bounds cases in a specific manner.

The size of the adder is effectively only 80 bits extended on either side by the mantissa size of the result, i.e. 24+80+ 24=128 bits. The remaining 25 bits on the right in the 153 bits are only used to calculate the rounding affecting the mantissa of the result. The adder stages processing the 24 least significant bits and the 24 most significant bits among the 128 bits can be simplified by the fact that these bits are all fixed for the input receiving product p. The result of the addition can be expressed as a fixed-point value over 128+o bits, where o represents a few bits to take into account possible carryovers.

The mantissa of the final result in binary32 floating-point format is taken from the 24 most significant bits of the addition result, and the exponent of the floating-point result is directly provided by the position of the most significant bit of the mantissa.

Figure 5:
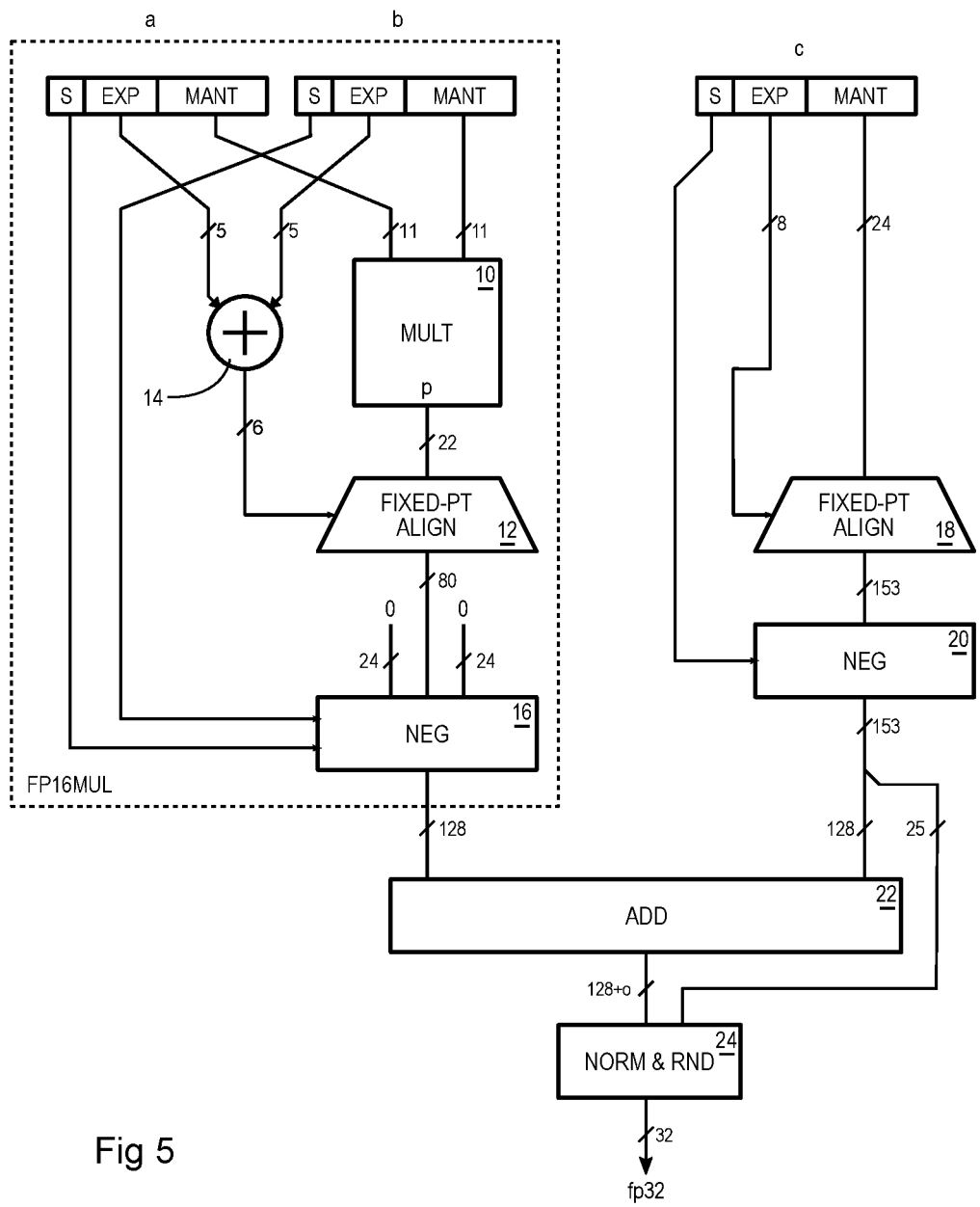
FIG. 5 represents a schematic diagram of an embodiment of a mixed-precision FMA operator using the technique of FIGS. 4A and 4B to achieve correct rounding.

FIG. 5 is a block diagram of a mixed precision FMA operator (fp16/fp32) implementing the technique of FIGS. 4A and 4B. It should be noted that the diagrams shown here are simplified and illustrate only those elements that are useful for understanding the disclosure. Certain elements required conventionally to deal with the specificities of standard floating-point numbers, such as subnormal numbers, undefined numbers (NaN), infinity, and others, are not described.

The FMA operator includes a floating-point multiplication unit FP16MUL providing an 80-bit fixed-point result. The unit receives two multiplicands a and b in fp16 (or binary16) format. Each of the multiplicands has a sign bit S, a 5-bit exponent EXP, and a 10+1-bit mantissa MANT (whose most significant bit, implicitly at 1, is not stored). Both mantissas are supplied to a multiplier 10 which calculates a product p as a 22-bit integer. The product p is supplied to an alignment circuit 12 which is controlled by an adder 14 producing the sum of the exponents of the multiplicands a and b. The alignment circuit 12 is configured to align the 22 bits of the product p over 80 lines at the position defined by the sum of the exponents plus 1 as described in relation to FIG. 3. Circuit 12 thus converts the floating-point result of the multiplication to a fixed-point number of 80 bits.

As discussed in connection with FIGS. 4A and 4B, the 80 bits output by the alignment circuit are padded to the left and the right by 24 bits at 0 to form a fixed-point number of 128 bits, which corresponds to the absolute value of the product. This 128-bit absolute value is passed through a negation circuit 16 configured to invert the sign of the absolute value when the signs of the multiplicands are opposite. In the case of a negative sign, the negation circuit adds the sign bit, at 1, to the left of the 80-bit output of the register. The 128-bit number thus produced by the negation circuit 16 forms the output of the multiplication unit FP16MUL.

The addition operand c supplied to the FMA operator, in fp32 (or binary32) format, has a sign bit S, an 8-bit exponent EXP, and a 23+1-bit mantissa MANT. The mantissa is supplied to an alignment circuit 18 which is controlled by the exponent of operand c. The circuit 18 is configured to align the 24 bits of the mantissa over 153 lines, at a position defined by the exponent, as discussed in connection with FIG. 4A. Circuit 18 thus converts the floating-point operand to a fixed-point number of 153 bits.

Recall that the 153 bits are not sufficient to cover the full dynamics of the exponent of an fp32 number, but only the exponents between 56 and −73, the value 56 corresponding to the position of the most significant bit of the 153-bit number. Thus, circuit 18 may be configured to saturate the exponent at thresholds 56 and −73. The result is that the mantissa is stuck to the left or the right of the 153-bit number when the exponent is out of range. In any case, as discussed in relation to FIG. 4B, out-of-range cases are handled differently.

The number provided by circuit 18 is passed through a negation circuit 20 controlled by the sign bit of the operand. Alternatively, it is possible to omit circuit 20 and, at circuit 16, invert the sign of the product if it is not equal to the sign of operand c.

A 128-bit adder 22 receives the output of the unit FP16MUL and the 128 most significant bits of the 153-bit signed number provided by the negation circuit 20. The result of the addition is a fixed-point number of 128+o bits, where o represents a few bits to allow for possible carry propagations. The 25 least significant bits of the output of the negation circuit are used downstream in the rounding calculation.

The output of the adder 22 is processed by a normalization and rounding circuit 24 which has the function of converting the fixed-point result of the addition into a floating-point number in fp32 format. For this purpose, as mentioned in connection with FIGS. 4A and 4B, the mantissa of the fp32 number is taken from the 24 most significant bits of the result of the addition, and the exponent is determined by the position of the most significant bit of the mantissa in the result of the addition. The rounding is calculated correctly, in a general case, over the bits immediately following the mantissa in the addition result, followed in turn by the 25 least significant bits of the output of negation circuit 20.

FIG. 5 does not illustrate possible circuit elements to deal with out of range cases where the exponent of operand c is greater than or equal to 57, or less than or equal to −74. These elements are trivial given the functionality described, and several variants are possible.

For example, when the exponent is greater than or equal to 57, circuit 24 takes the mantissa stuck to the left in the addition result, directly takes the exponent of the operand c (instead of the position of the mantissa), and calculates the rounding by considering the guard bit G at 0 and using the bits after the mantissa in the addition result to determine the sticky bit S. The rounding bit R is considered to be 0 if the content of register REG80 is positive, or 1 if the content of register REG80 is negative.

When the exponent is less than or equal to −74, circuit 24 may operate as for the nominal case, with the mantissa of the operand c stuck to the right in the 25 bits outside the adder, contributing to the value of the sticky bit S.

Of course, if the product is zero, the result of the addition is directly the operand c.

Figure 6:
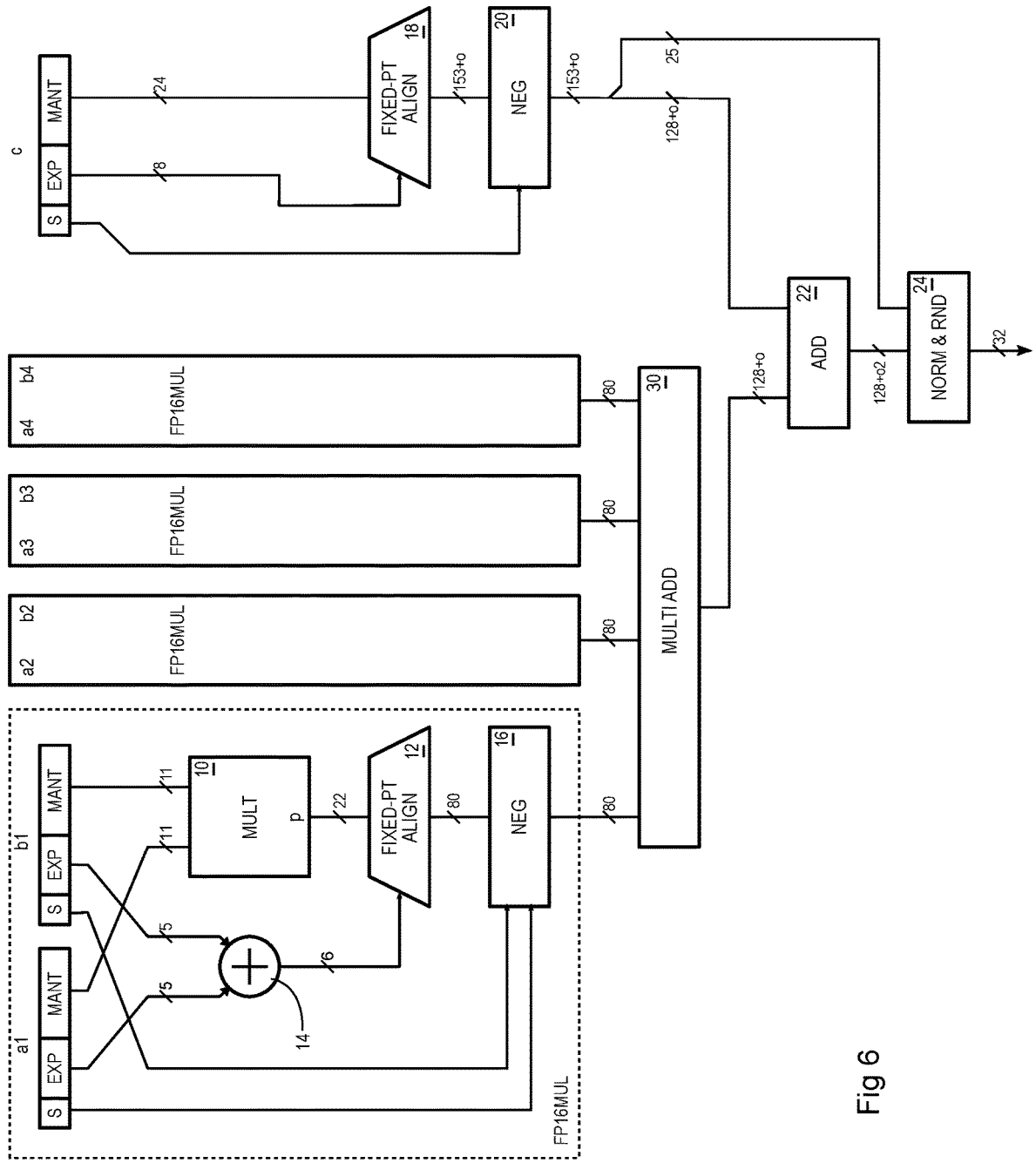
FIG. 6 represents a schematic diagram of a mixed precision dot-product and accumulation operator using the technique of FIGS. 4A and 4B to achieve correct rounding.

FIG. 6 represents a schematic diagram of a mixed precision dot-product and accumulation operator using the technique of FIGS. 4A and 4B to achieve correct rounding.

Compared to the FMA operator of FIG. 5, the dot-product and accumulation operator aims at adding several partial products, e.g. four here, and an addition operand c. Each partial product is calculated by a respective unit FP16MUL of the type of FIG. 5. The multiplication results are expressed in 80-bit fixed-point format, which here need not be padded to the left and right by 24 fixed bits. The four fixed-point partial product results are supplied to an 80-bit multi-adder 30.

The multi-adder 30 may have a variety of conventional structures. For four addition operands, a hierarchical structure of three full adders may be used, or a structure based on Carry-Save Adders (CSA), as described in US patent application 2018/0321938, with the difference that the addition operands here are 80-bit fixed-point numbers, each of sufficient size to cover the full dynamic range of the corresponding partial product.

The result of the multi-adder has the characteristic of being exact, regardless of the values of the partial products. In particular, two large partial products can cancel each other without affecting the accuracy of the result, since all the bits of the partial products are kept at this point. In conventional operators, a rounding is performed as soon as this addition of partial products is performed.

In addition, each multiplication unit FP16MUL is independent of the others, as it is not necessary to compare the exponents of the partial products to achieve a relative alignment of the mantissas of the partial products. Indeed, each unit converts to the same fixed-point format common to all numbers. As a result, it is particularly simple at a design level to vary the number of multiplication units as required, since there are no interdependencies between the multiplication units. Adapting the structure of the multi-adder to the number of operands is also simple, as it is performed according to systematic design rules. The complexity of the operator can thus be kept proportional to the number of multiplication units.

The result of the addition of the partial products may be more than 80 bits. Thus, the result is encoded over 80+o bits, where o designates a small number of additional significant bits to accommodate the overflow, equal to the base-2 logarithm of the number of partial products to be added, plus the sign bit. Thus, for four partial products to be added, o=3.

The 80+o-bit fixed-point number thus provided by the multi-adder is to be added with the addition operand c, converted to a fixed-point number over a limited dynamic range, as shown in relation to FIGS. 4A and 4B. The limited dynamic range is based here on a size of 80+o bits instead of 80 bits. Thus, as shown on the right for the processing of the addition operand c, the alignment circuit 18 performs a conversion to a fixed-point number of 153+o bits, and the downstream processing is adapted accordingly. In particular, the 128+o most significant bits are supplied to the adder 22 on the side of the addition operand c. On the partial product sum side, the 80+o bits supplied by the multi-adder 30 are padded left and right by 24 fixed-value bits (0 for a positive result or 1 for a negative result).

The output of adder 22 is processed as in FIG. 5, except that the number of bits 128+o2 is slightly larger, o2 including the o bits and one or more extra bits to accommodate an overflow from adder 22.

As a result, this operator structure performs only a single rounding, when converting the result of the final addition to a floating-point number, and this single rounding is calculated correctly in all circumstances.

Many variants and modifications of the described embodiments will appear to those skilled in the art. The operators illustrated in FIGS. 5 and 6 have been described as combinatorial logic circuits. In a processor core clocked at a relatively high frequency, the latency of the operator purely in combinatorial logic may be too high. In this case, the operators may have a pipelined structure, with registers to store intermediate results, for example, to store the output numbers of alignment circuits 12 and 18 (as was also discussed in connection with FIG. 3).

Although mixed-precision operators using the fp16 and fp32 formats have been described, and are today of real interest in terms of performance/complexity ratio, the principles are theoretically applicable to other standard or non-standard precision formats.

What is claimed is:

1. A hardware operator for dot-product computation, the hardware operator comprising:
   a plurality of multipliers each receiving two multiplicands in a form of floating-point numbers encoded in a first precision format;
   an alignment circuit associated with each multiplier, configured to, based on exponents of corresponding multiplicands, convert a result of a multiplication of the corresponding multiplicands into a respective fixed-point number having a sufficient number of bits to cover a full dynamic range of the multiplication;
   a multiadder configured to add without loss the fixed-point numbers provided by the multipliers, providing a sum in a form of a fixed-point number;
   an input for a floating-point addition operand encoded in a second precision format having a higher precision than the first precision format;
   an alignment circuit associated with the addition operand, configured to, based on an exponent of the addition operand, convert the addition operand into a fixed-point number of reduced dynamic range relative to a dynamic range of the addition operand, having a number of bits equal to a number of bits of the fixed-point sum, extended on either side by at least a size of a mantissa of the addition operand; and
   an adder configured to add without loss the fixed-point sum and the fixed-point number of reduced dynamic range and produce an adder result.

2. The operator according to claim 1, comprising a rounding and normalization circuit configured to convert the adder result into a floating-point number encoded in the second precision format, by taking a mantissa from the most significant bits of the adder result, calculating a rounding from remaining bits of the adder result, and determining the exponent of the addition operand from a position of a most significant bit in the adder result.

3. The operator according to claim 2, wherein:
   the fixed-point number of reduced dynamic range is extended to the right by a number of bits at least equal to the size of the mantissa of the addition operand; and
   the rounding and normalization circuit uses the bits of the extension of the fixed-point number of reduced dynamic range to calculate the rounding.

4. The operator according to claim 2, configured to provide as a result the addition operand when the exponent of the addition operand exceeds a capacity of the fixed-point number of reduced dynamic range.

5. A method of calculating a dot-product of binary numbers, the method comprising:

calculating a plurality of multiplications in parallel by a plurality of multipliers, each from two multiplicands that are floating-point numbers encoded in a first precision format;

based on exponents of the multiplicands of each multiplication, converting, by respective alignment circuits associated with each multiplier, a result of a corresponding multiplication into a respective fixed-point number having a sufficient number of bits to cover a full dynamic range of the multiplication;

adding without loss the fixed-point numbers resulting from the multiplications to produce a sum in the form of a fixed-point number by a multiadder;

receiving a floating-point addition operand encoded in a second precision format having a higher precision than the first precision format;

on the basis of an exponent of the addition operand, converting, by an alignment circuit associated with the addition operand, the addition operand into a fixed-point number having a reduced dynamic range relative to a dynamic range of the addition operand, having a number of bits equal to a number of bits of the fixed-point sum, extended on both sides by at least a size of a mantissa of the addition operand; and adding by an adder configured to add without loss the fixed-point sum and the fixed-point number of reduced dynamic range.

\* \* \* \* \*